United States Patent [19]

Hinds et al.

[11] Patent Number: 4,936,503
[45] Date of Patent: Jun. 26, 1990

[54] UNITARY WAND TIP AND MANUFACTURING METHOD

[75] Inventors: Albert G. Hinds, Placerville; Quincy D. Allison, Boulder Creek, both of Calif.

[73] Assignee: H-Square Corporation, Sunnyvale, Calif.

[21] Appl. No.: 355,964

[22] Filed: May 22, 1989

[51] Int. Cl.⁵ ............................................. B23K 1/04
[52] U.S. Cl. ................................. 228/173.4; 228/174; 72/367; 29/460
[58] Field of Search .................. 228/173.4, 176, 214, 228/174; 29/460; 72/367

[56] References Cited

U.S. PATENT DOCUMENTS 3,731,517 5/1973 Johnson ........................... 72/367

Primary Examiner—Kenneth J. Ramsey

[57] ABSTRACT

A metallic tip for attachment to a vacuum-operated wand of the type for handling of semiconductor wafers and the like. The wand tip has a tubular portion for attachment to the wand and has a flattened portion with generally parallel upper and lower walls extending from the tubular portion. The lower wall has a slotted region to expose the inner surface of the upper wall so as to define a vacuum pocket. The upper wall has a raised region to promote stiffness and to allow fluid communication between the tubular portion and the vacuum pocket. The upper and lower walls are in physical contact and are in vacuum-sealed relation about the major portion of the periphery of the vacuum pocket. The unitary tip is formed by compressing a portion of a tubular metallic member to form the upper and lower walls. A slot is machined into the lower wall to provide the vacuum pocket, afterwhich a mandrel is inserted into the tubular portion and a second compression is performed. The lower wall is planar, but the upper wall includes the raised region having a shape and dimensions determined by the mandrel. Vacuum sealing of the periphery of the vacuum pocket includes brazing of the two walls, which are in physical contact.

8 Claims, 1 Drawing Sheet

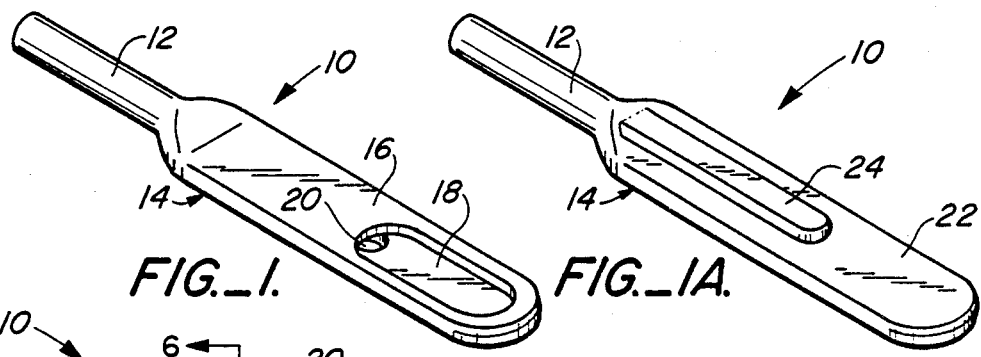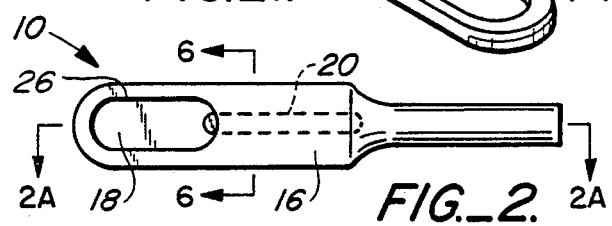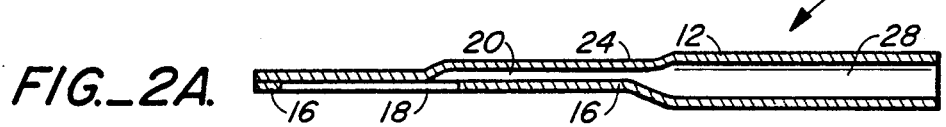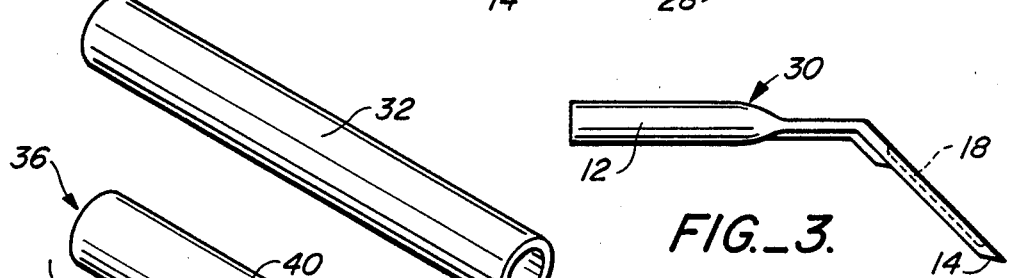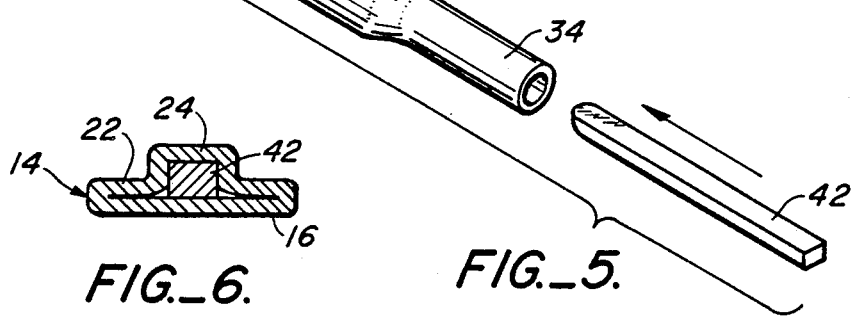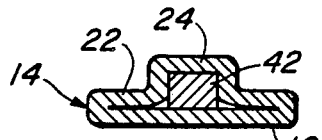

UNITARY WAND TIP AND MANUFACTURING METHOD

TECHNICAL FIELD

The present invention relates generally to devices for handling articles by vacuum pickup and more particularly to metallic tips for attachment to a vacuum operated tool for the handling of semiconductor wafers.

BACKGROUND ART

In the manufacture of semiconductor wafers, various instruments are used to individually move wafers. For example, tweezers are utilized at times. Typically, however, a vacuum-operated apparatus is used for the handling of semiconductor wafers. Such an apparatus includes a vacuum-actuating wand and a replaceable wand tip having a vacuum pocket in evacuation communication with the wand. In operation, the surface of the wand tip associated with the vacuum pocket is brought into contact with a wafer, afterwhich the wafer is maintained against the surface until the vacuum is released.

The spatula-like wand tip is a popular design for the handling of semiconductor wafers and the like. The spatula design generally refers to tips which have a wand attachment segment and a wafer pickup segment that is relatively flat for releasable engagement with a semiconductor wafer. Attempts have been made to manufacture spatula-like wand tips by the mere compressing of one segment of a tube to provide parallel but non-contacting upper and lower sides. A hole cut into the lower side of the compressed segment allows fluid communication with the tubular portion for the evacuation of air. At the end of the compressed segment opposite to attachment segment, the opposed sides must be pressed together, and preferably tightly sealed with a weld joint or solder. Such tips have the advantage of ease of manufacture, but include disadvantages as well. Parallel, non-contacting sides provide a number of areas for the collection of abrasive particles and contaminants, both of which are detrimental to high-yield wafer manufacturing. Moreover, thin-walled tubing is utilized, and the wand tip is therefore susceptible to bending. Bending of the wand tip jeopardizes the vacuum seal integrity since a wafer-contacting surface must be planar.

Thus, in the manufacture of metallic wand tips, the common practice is to insert a blade into the flattened portion of the tip. Such a wand tip is described in U.S. Pat. No. 4,736,508 to Poli et al. The vacuum tip of Poli et al. includes a blade having an axial notch. The blade adds stiffness to the tip to maintain a flat surface for proper vacuum seal to the wafer. The axial notch allows the formation of a passage through the flattened portion to a window formed in one side. While the Poli et al. tip has advantages over the above-described wand tip, great care must be taken to ensure that the blade is securely fixed to the flattened portion and that the inclusion of the blade does not create voids which cause vacuum leakage and can collect contamination. A hole is cut through a side of the flattened portion of the Poli et al. tip for insertion of a brazing material to the inserted blade. Thus, the method of manufacturing the vacuum tip is labor-intensive as compared to the above-described wand tip.

It is an object of the present invention to provide a wand tip and a method of manufacturing the same which significantly reduces the risk of formation of voids, and yet provides a structurally sound member for the handling of semiconductor wafers and the like.

SUMMARY OF THE INVENTION

The above object has been met by an apparatus and method which eliminate the occurrence of voids between adjacent members of a wand tip by providing a unitary tip having structural ribs which ensure necessary stiffness.

The tip is a unitary metallic member having a flattened article-retaining portion and a tubular portion adapted for attachment to a vacuum-operated tool. Preferably, the tip is a stainless steel member. The flattened portion has generally parallel upper and lower walls extending from an end of the tubular portion. The lower wall has a slotted region to form a vacuum pocket. The upper and lower walls are in vacuum sealed or tight relation about a major portion of the periphery of the pocket, but a raised interior region in the upper wall promotes stability and allows fluid communication between the vacuum pocket and the tubular portion of the tip. The upper and lower walls are in physical contact, and a brazing compound is used to seal the contact. The raised region and the brazing function as the structural ribs which ensure necessary stiffness.

In the formation of the wand, one portion of a stainless steel tube is reduced in diameter. Alternatively, a portion of the tube may be expanded. The tube is then electropolished and one portion of the tube is compressed axially to form upper and lower walls. The vacuum pocket is machined through the lower wall and a mandrel is inserted into the portion which remains tubular. A second compression is performed to bring the upper and lower walls into a parallel relation with each other. The lower wall is flat, while the upper wall has the raised region. The shape of the raised region is a function of the shape of the inserted mandrel. The mandrel is then removed and the vacuum pocket is machined through the lower wall. A tunnel now exists between the pocket and the tubular portion of the tip which was not compressed or flattened.

During compression of the flattened, or spatula, portion, deformation is away from the vacuum pocket surface, creating an article-contacting wall which is nearly flat and which requires minimal lapping after brazing. That is, at the "folded" edges of the flattened portion, the natural increase in thickness is allowed to be formed toward the upper wall where, unlike the article-contacting wall, flatness is not critical. The edges of the vacuum pocket are thereafter vacuum sealed by use of a brazing compound in a hydrogen furnace. If desired, the wand tip can be bent to facilitate handling of a semiconductor wafer. Depending on the application, the wand tip can be plated and/or coated with a plastic material.

While the present invention was designed for handling of semiconductor wafers, handling of other lightweight articles, such as lenses or disks, is possible. An advantage of the present invention is that the raised surface acts as a stiffening rib to increase resistance to bending which can cause a loss of flatness and, therefore, vacuum-seal integrity. An applied force having a directional component tending to bend the wand tip along a particular plane must overcome the added strength provided by the increase in material along that plane. That is, additional strength is provided by the change in the aspect ratio along the particular plane at which a bend might normally occur. Moreover, because the upper and lower walls are in at least close proximity, it is possible to form a high quality brazing joint in joining the two walls, thereby further improving stiffness. By "at least close proximity" what is meant is that the walls are preferably in physical contact, but are at the least sufficiently close so that the high quality brazing joint is provided using the brazing techniques common in the art. The raised pocket allows the edges of the wand tip to be pressed together for this purpose, while the center axial portion of the tip remains spaced apart to allow air flow.

Another advantage of the present invention is that the single-piece construction eliminates the need of fixing adjacent elements to one another. As a result, the risk of formation of voids is significantly reduced. Voids tend to retain chemicals used in tip manufacturing plating processes and during wafer handling. Such chemicals can leach out and cause degradation of plating and can damage wafers. Also reduced is the likelihood of imperfections within the brazing reservoir. Brazing imperfections result in vacuum leakage and are unrepairable and, therefore, reduce the yield of acceptable wand tips from each manufacturing batch.

BRIEF DESCRIPTION OF THE DRAWINGS

FIGS. 1 and 1A are perspective views of a wand tip in accord with the present invention.

FIG. 2 is a bottom view of the wand tip of FIG. 1.

FIG. 2A is a side sectional view of the wand tips taken along lines 2A—2A of FIG. 2.

FIG. 3 is a side view of a second embodiment of the present invention.

FIG. 4 is a perspective view of a tube used in the manufacturing process of the wand tip of FIG. 1.

FIG. 5 is a perspective view of the tube of FIG. 4 reduced in diameter at one portion and having a mandrel at the mouth of that portion.

FIG. 6 is a cross-sectional view taken along lines 6—6 of FIG. 2, but with mandrel inserted.

FIG. 7 is a side sectional view of the wand tip of FIG. 2A, having a plastic coating thereon.

BEST MODE FOR CARRYING OUT THE INVENTION

With reference to FIGS. 1 and 1A, a wand tip 10 includes a tubular portion 12 and a flattened, or spatula, portion 14. The tubular portion has an outside diameter to be slidably received within a vacuum-operated wand, not shown, of the type employed in the handling of semiconductor wafers. The tubular portion may be frictionally fit, for example, within one or more O-rings in a vacuum passageway of the wand. Alternatively, the tubular portion has an inside diameter to receive an adapter which is coupled to the wand.

A wand includes a trigger mechanism to selectively evacuate air from the wand tip 10. The flattened portion 14 has an article-contacting wall 16 having a vacuum pocket 18. The vacuum pocket is in fluid communication with an axial passage through the tubular portion 12 via a vacuum cavity 20. Thus, actuation of the wand creates a sub-atmospheric pressure zone within the pocket 18 to provide the force necessary for releasably handling a semiconductor wafer.

The upper wall 22 of the flattened portion 14 has a central raised region 24. The upper wall 22 is in physical contact with the lower article-contacting wall 16, but the raised region 24 permits air flow from the vacuum pocket 18 to the tubular portion. Moreover, the raised region promotes stiffness. The raised region acts as a stiffening rib against applied forces having a directional component tending to bend the wand tip 10 along a plane passing through the raised region. Resistance to bending is critical since the article-contacting wall 16 must be planar in order to preserve vacuum-seal integrity. The depressed region about the raised region of the upper wall 22 is planar and physically contacts the inner surface of the lower article-contacting wall.

Referring now to FIGS. 2 and 2A, the vacuum pocket 18 is formed by machining a slot 26 into the article-contacting wall 16 of the wand tip 10. The slot may be 0.95 inch in length and 0.375 inch in width, but this is not critical. In any case, the area defined by the slot should not exceed one-fourth the area of a semiconductor wafer to be handled. The slot 26 and the vacuum cavity 20 are coextensive only at the end of the vacuum pocket nearest the tubular portion 12. As will be explained more fully below, the article-contacting wall 16 is brazed to the upper wall 22 other than at the intersection of the vacuum pocket 18 with the vacuum cavity 20. Physical contact of the upper and lower walls 16 and 22 along the major portion of the slot 26 provides a number of advantages. Firstly, the ability to braze the upper and lower walls of the flattened portion improves stiffness. A high quality brazing joint is not possible if the surfaces to be brazed are not in at least close proximity to one another. Secondly, by pressing the walls into a contacting position, the risk of formation of "traps" is greatly reduced. By bringing the walls into nearly contacting relation, any areas between the walls can be filled with the brazing compound. Elimination of traps is critical since such areas can retain chemicals used in the plating and cleaning processes of wafer manufacturing, afterwhich the retained chemical can resurface to damage a wafer.

In operation, a wand is triggered to evacuate air from the wand tip 10. Air flow takes place from the vacuum pocket 18, through the vacuum cavity 20 and into the axial passageway 28 through the tubular portion 12, as shown in FIG. 2A. The article-contacting wall 16 is pressed against a semiconductor wafer which is to be relocated. Upon displacement of the wafer to the desired location, the vacuum is released. While the wand tip has been explained with reference to the handling of semiconductor wafers, the tip can be used in the handling of other small articles as well.

Referring now to FIG. 3, a second embodiment of a wand tip 30 is shown. The wand tip 30 is identical to that of FIG. 1, having a tubular portion 12 and a flattened portion 14, but the flattened portion includes a bend of approximately 45 degrees. The surface area about the vacuum pocket 18 must remain flat in order to ensure vacuum-seal integrity. However, the bend in the wand tip 30 is desirable where access to semiconductor wafers is difficult.

The method of manufacture of a wand tip in accord with the present invention will be explained with reference to FIGS. 2 and 4–7. FIG. 4 illustrates a stainless steel tube of a type which is compatible with hydrogen furnace blazing techniques. In the manufacture of a wand tip for the handling of semiconductor wafers, a preferred length is 3.5 inches. One portion of the tube is then reduced in diameter by a spinning process to obtain the desired outside diameter for snug fit to a wand or wand adapter. Typically, a direct fit to a wand requires an outside diameter slightly greater than 0.25 inch. Alternatively, the tube 32 may have an original outside diameter which requires expansion, rather than reduction.

In FIG. 5, the reduced segment 34 corresponds in length to the tubular portion 12 of FIG. 1. The length of the reduced segment is approximately one inch. The member 36 also has a transition segment 38 and a segment 40 having a larger outside diameter. The member 36 is electropolished to remove scale, slag, oils and other contaminants which are deleterious to a brazing process.

After electropolishing, the mandrel 42 shown in FIG. 5 is inserted through the reduced segment 34 for partial extension through the larger segment 40. The flattened portion of the wand tip is then formed. Compression of the segment 40 may be by hydraulic, pneumatic, or mechanical methods known in the art, using direct pressure or inertial systems. Referring now to FIG. 6, the raised region 24 forms about the mandrel 42. The size and shape of the mandrel determine the size and shape of the vacuum cavity formed between the raised region 24 and the article-contacting wall 16. Preferably, the lower and upper walls 16 and 22 are not immediately brought into physical contact. Instead, a gap is provided to facilitate machining of the vacuum pocket 18, shown in FIG. 2, and removal of burrs. In such case, the insertion of the mandrel 42 is not critical to this first compression.

After machining of the slot 26 which forms the vacuum pocket, a second compression takes place to bring the lower and upper walls 16 and 22 into physical contact or, at the least, sufficiently close proximity to permit a high quality brazing. It is during the second compression that insertion of the mandrel is a necessity. Optionally, the wand tip can be annealed to allow plastic deformation of material during this second compression. During compressions, dyes are used to flatten the tubing and form the raised region 24 so that any deformation at the edges of the flattened portion occur in a direction away from the lower surface which is to make contact with the semiconductor wafer. As noted above, to ensure vacuum-seal integrity, the lower surface must be planar. Thus, in those areas of the wand tip in which the tubing creases, folds and transitions from the lower wall to the upper wall, the natural increase in thickness adjacent to the crease is allowed to be formed toward the upper wall 22 where the degree of flatness and vacuum seal are not critical. After final compression, the mandrel 42 is removed to provide the vacuum cavity between the upper and lower walls.

A granulated copper brazing compound suspended in a binder is applied to the slot 26 which forms the vacuum pocket 18 shown in FIG. 2. Other brazing compounds can be used. The compound frames the vacuum pocket 18 with the exception of the fluid communication between the pocket and the vacuum cavity 20. The wand tip 10 is then placed in a hydrogen furnace and brazed at approximately 1,100° C. Depending upon product design, the flattened portion 14 of the wand tip 10 is then bent. A bend of as much as ninety degrees is possible. It is important to lap the article-contacting wall 16 so as to ensure proper flatness. A wet sanding wheel or belt may be used, as well as other lapping devices. As an alternative, the article-contacting wall can be machined flat.

The wand tip is then optionally electropolished and may be provided with a hard chrome or other plating. Referring to FIG. 7, the vacuum wand 10 is shown as including a coat 44 of plastic material. The plastic material must be of the type which is ideally nonparticulating and nonabrasive. The coating illustrated in FIG. 7 covers the entirety of the wand tip 10. Such coverage is desirable where the axial passageway 28 receives an adapter which is coupled to the vacuum-operated wand. If on the other hand, the tubular portion 12 of the wand tip is to be received within the wand, the coating 44 should only be about the flattened portion 14 of the tip.

While the present invention has been described as being made of stainless steel, other metals can be utilized as well. For example, the wand tip may be made of aluminum, with the type of brazing compound and the furnace temperature being selected in accord with the choice of metal.

Moreover, the manufacturing method described above can be used in the production of plastic wand tips. Depending upon the choice of plastic material, it may be necessary to include a step of heating the material prior to compression, thereby facilitating the flattening step. An additional distinguishing feature would be the use of an adhesive in place of a brazing compound during the sealing step, although this step may be eliminated entirely by selection of production compressive forces and temperatures to optimize sealing of upper and lower walls.

We claim:

1. A method of forming a unitary pickup tip of the type for attachment to a vacuum-operated tool comprising,
   inserting a mandrel into a first end of a tubular metallic member having an article-retaining portion and having an attachment portion associated with said first end, said inserting of the mandrel continuing until said mandrel extends partially through said article-retaining portion,
   compressing said article-retaining portion in a manner to form a flat lower wall and an upper wall having a depressed region generally parallel to said lower wall, said compressing forming said upper wall about said mandrel to create a raised region thereon, said raised region providing a cavity in said article retaining portion,
   machining a slot through said lower wall to frame a vacuum pocket extending to the inside surface of said upper wall, said slot disposed for fluid communication of said vacuum pocket with an end of said cavity, and
   vacuum sealing the periphery of said slot other than at an end of said vacuum pocket in fluid communication with said cavity.

2. The method of claim 1 further comprising extracting said mandrel from said metallic member prior to machining of the slot, and wherein said vacuum sealing includes reinserting said mandrel into said cavity and includes compressing said article-retaining portion to provide a second flattening of said upper and lower walls, said mandrel thereafter being extracted.

3. The method of claim 2 wherein said vacuum sealing further includes brazing said periphery.

4. The method of claim 2 further comprising annealing said metallic member prior to said second flattening.

5. The method of claim 2 further comprising coating said metallic member after said vacuum sealing.

6. The method of claim 1 further comprising one of reducing the diameter of said attachment portion and expanding the diameter of said article-retaining portion prior to said inserting a mandrel into said tubular metallic member.

7. The method of claim 1 further comprising extracting said mandrel from said metallic member after said machining of the slot.

8. A method of forming a unitary pickup tip of the type for attachment to a vacuum-operated tool comprising, compressing a portion of a tubular metallic member to form an upper wall and a lower wall, the compressed portion being an article-retaining portion, machining a slot through said lower wall to frame a vacuum pocket in said article-retaining portion, inserting a mandrel into an end of said metallic member to partially extend through said article retaining portion, compressing for a second time said article retaining portion in a manner to form a flat lower wall and an upper wall having a depressed region generally parallel to said lower wall, said second compressing forming said upper wall about said mandrel to create a raised region thereon, said raised region providing a cavity in said article-retaining portion, and vacuum sealing the periphery of said slot other than at an end of said vacuum pocket in fluid communication with said cavity.

* * * * *